(12) United States Patent
Shu et al.

(10) Patent No.: US 10,461,755 B2
(45) Date of Patent: Oct. 29, 2019

(54) DIGITALLY ASSISTED FEEDBACK LOOP FOR DUTY-CYCLE CORRECTION IN AN INJECTION-LOCKED PLL

(71) Applicant: Oracle International Corporation, Redwood Shores, CA (US)

(72) Inventors: Guanghua Shu, Belmont, CA (US); Frankie Y. Liu, Palo Alto, CA (US); Suwen Yang, Mountain View, CA (US); Ziad Saleh Shehadeh, Mountain View, CA (US); Eric Y. Chang, San Mateo, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/980,467

(22) Filed: May 15, 2018

(65) Prior Publication Data
US 2019/0115925 A1 Apr. 18, 2019

Related U.S. Application Data

(60) Provisional application No. 62/571,520, filed on Oct. 12, 2017.

(51) Int. Cl.
| | |
|---|---|
| *H03L 7/06* | (2006.01) |
| *H03L 7/081* | (2006.01) |
| *H03L 7/099* | (2006.01) |
| *H03K 5/156* | (2006.01) |
| *H03L 7/24* | (2006.01) |
| *H03L 7/087* | (2006.01) |

(Continued)

(52) U.S. Cl.
CPC ......... *H03L 7/0814* (2013.01); *H03K 5/1565* (2013.01); *H03L 7/081* (2013.01); *H03L 7/087* (2013.01); *H03L 7/0996* (2013.01); *H03L 7/0998* (2013.01); *H03L 7/197* (2013.01); *H03L 7/1976* (2013.01); *H03L 7/24* (2013.01); *H03K 3/0315* (2013.01); *H03L 7/0995* (2013.01)

(58) Field of Classification Search
CPC ........ H03J 2200/10; H03L 7/099; H03L 7/18; H03L 7/24
See application file for complete search history.

(56) References Cited

U.S. PATENT DOCUMENTS

2012/0062293 A1* 3/2012 Liang ................. H03L 7/23
327/157

* cited by examiner

*Primary Examiner* — Sibin Chen
(74) *Attorney, Agent, or Firm* — Park, Vaughan, Fleming & Dowler LLP (57) ABSTRACT

We disclose a system, which performs a duty-cycle correction operation for an injection-locked phase-locked loop (PLL). The system first obtains a pattern of positive and negative error pulses at rising and falling edges of a reference clock signal for the injection-locked PLL, wherein the pattern specifies deviations of the reference clock signal from a 50% duty cycle. The system multiplies the pattern of positive and negative error pulses by a duty-cycle distortion (DCD) template, which specifies a sign of a duty-cycle error for the reference clock signal, to calculate duty-cycle distortion values. The system then accumulates the duty-cycle distortion values to produce a duty-cycle-error amplitude. Next, the system multiplies the duty-cycle-error amplitude by the DCD template to produce a duty-cycle correction signal. Finally, the system uses the duty-cycle correction signal to compensate for timing errors in the injection-locked PLL, which are caused by duty-cycle variations in the reference clock signal.

20 Claims, 10 Drawing Sheets

(51) Int. Cl.
*H03L 7/197* (2006.01)
*H03K 3/03* (2006.01)

DIGITALLY ASSISTED FEEDBACK LOOP FOR DUTY-CYCLE CORRECTION IN AN INJECTION-LOCKED PLL

RELATED APPLICATION

This application claims priority under 35 U.S.C. § 119 to U.S. Provisional Application No. 62/571,520, entitled "Injection-Locking PLL with Frequency Drift Tracking and Duty-Cycle Distortion Cancellation" by the same inventors as the instant application, filed on 12 Oct. 2017, the contents of which are incorporated herein by reference.

BACKGROUND

Field

The disclosed embodiments generally relate to the design of injection-locked phase-locked loops (PLLs). More specifically, the disclosed embodiments relate to the design of a digitally assisted feedback loop to facilitate duty-cycle correction in an injection-locked PLL.

Related Art

Conventional inductor-capacitor-based clocking sources have not been scaling well as semiconductor integration densities continue to increase. This has caused ring-based PLLs to become more popular, especially in area-constrained designs associated with the latest technology nodes. However, compared to their LC-based counterparts, ring-based PLLs inherently have more jitter, which is exacerbated as the technology scales further. Moreover, while the injection-locking technique is widely used in LC oscillators, its application to ring oscillators in deep sub 50 nm technology has been challenging due to high noise, frequency drift, and supply sensitivity in ring oscillators.

A particular problem arises in situations where injection locking is used to suppress phase errors while frequency correction is taking place. In this case, the injection locking will tend to mask the frequency errors while suppressing the phase errors. This makes it hard to correct frequency errors in the PLL, which can significantly degrade the quality of the resulting clock signal. This problem can be addressed by periodically suppressing the injected pulses produced by the injection-locking mechanism to allow frequency correction to take place without interference from concurrent phase adjustments. (See related U.S. patent application Ser. No. 15/940,681, entitled "Injection Locking PLL with Frequency Drift Tracking and Duty-Cycle Distortion Cancellation" by inventors Guanghua Shu, et al., filed on 29 Mar. 2018, which also claims priority to U.S. Provisional Application No. 62/571,520.)

However, to make such a system work effectively, it is necessary to correct for duty-cycle distortion issues that arise in a reference clock signal for the PLL.

SUMMARY

The disclosed embodiments relate to a system, comprising a duty-cycle calibration circuit, which performs duty-cycle correction for an injection-locked PLL. During operation, the system first obtains a pattern of positive and negative error pulses at rising and falling edges of a reference clock signal for the injection-locked PLL, wherein the pattern specifies deviations of the reference clock signal from a 50% duty cycle. Next, the system multiplies the pattern of positive and negative error pulses by a duty-cycle distortion (DCD) template, which specifies a sign of a duty-cycle error for the reference clock signal, to calculate duty-cycle distortion values. The system then accumulates the duty-cycle distortion values to produce a duty-cycle-error amplitude. Next, the system multiplies the duty-cycle-error amplitude by the DCD template to produce a duty-cycle correction signal. Finally, the system uses the duty-cycle correction signal to compensate for timing errors in the injection-locked PLL, which are caused by duty-cycle variations in the reference clock signal.

In some embodiments, the duty-cycle correction circuit obtains the pattern of positive and negative error pulses from a phase detector in the injection-locked PLL.

In some embodiments, the DCD template specifies alternating positive and negative signs associated with a duty-cycle error of the reference clock signal.

In some embodiments, the injection-locked PLL includes: a reference input, which receives the reference clock signal; a frequency doubler, which doubles a frequency of the reference clock signal to produce a doubled reference clock signal; a ring oscillator, which generates an output clock signal; and a phase detector, which detects errors comprising deviations between edges of the output clock signal and the doubled reference clock signal; a frequency-tracking path, which adjusts a frequency of the ring oscillator based on the detected errors; a phase-tracking path, which adjusts a phase of the ring oscillator based on the detected errors by injecting pulses into the ring oscillator; a gating mechanism, which periodically suppresses the injected pulses to allow the frequency-tracking path to detect and remediate frequency errors without interference from concurrent phase adjustments; and the duty-cycle correction circuit, which corrects errors in the doubled reference clock signal caused by duty-cycle errors in the reference clock signal.

In some embodiments, while correcting the errors in the doubled reference clock signal, the duty-cycle correction circuit uses the duty-cycle correction signal to control a digitally controlled delay line (DCDL), which introduces corrective delays into the doubled reference clock signal.

In some embodiments, the duty-cycle correction signal is applied to the DCDL during a falling edge of the doubled reference clock signal to correct a timing of a subsequent rising edge of the doubled reference clock signal.

In some embodiments, the phase-tracking path of the injection-locked PLL comprises: a digital phase accumulator, which accumulates detected errors from the phase detector to produce a phase-accumulator output; an adder, which adds the phase-accumulator output to the duty-cycle correction signal to produce a composite correction signal; and the DCDL that inserts a variable delay, which is determined based on the composite correction signal, into the doubled reference clock signal to produce a corrected doubled reference clock signal.

In some embodiments, the frequency-tracking path of the injection-locked PLL comprises: a digital accumulator, which accumulates detected errors from the phase detector; a digital-to-analog converter, which converts an output of the digital accumulator into an analog reference voltage $V_{REF}$; and a low-dropout voltage regulator, which generates the supply voltage for the ring oscillator based on $V_{REF}$, wherein the supply voltage of the ring oscillator affects a frequency of the ring oscillator.

In some embodiments, the phase detector of the injection-locked PLL comprises a bang-bang phase detector.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Details

The disclosed embodiments implement an injection-locking technique for high frequency (>10 GHz) ring-oscillator-based PLLs. In doing so, the disclosed embodiments provide solutions for problems related to: frequency drift, high phase noise, and supply sensitivity in ring-oscillator designs in addition to a new digital duty-cycle calibration technique. When implemented in 7 nm FinFET technology, the disclosed injection-locked PLL design consumes 10.2 mW of power at 16 GHz and achieves an integrated RMS jitter of 275 fs.

Figure 1:
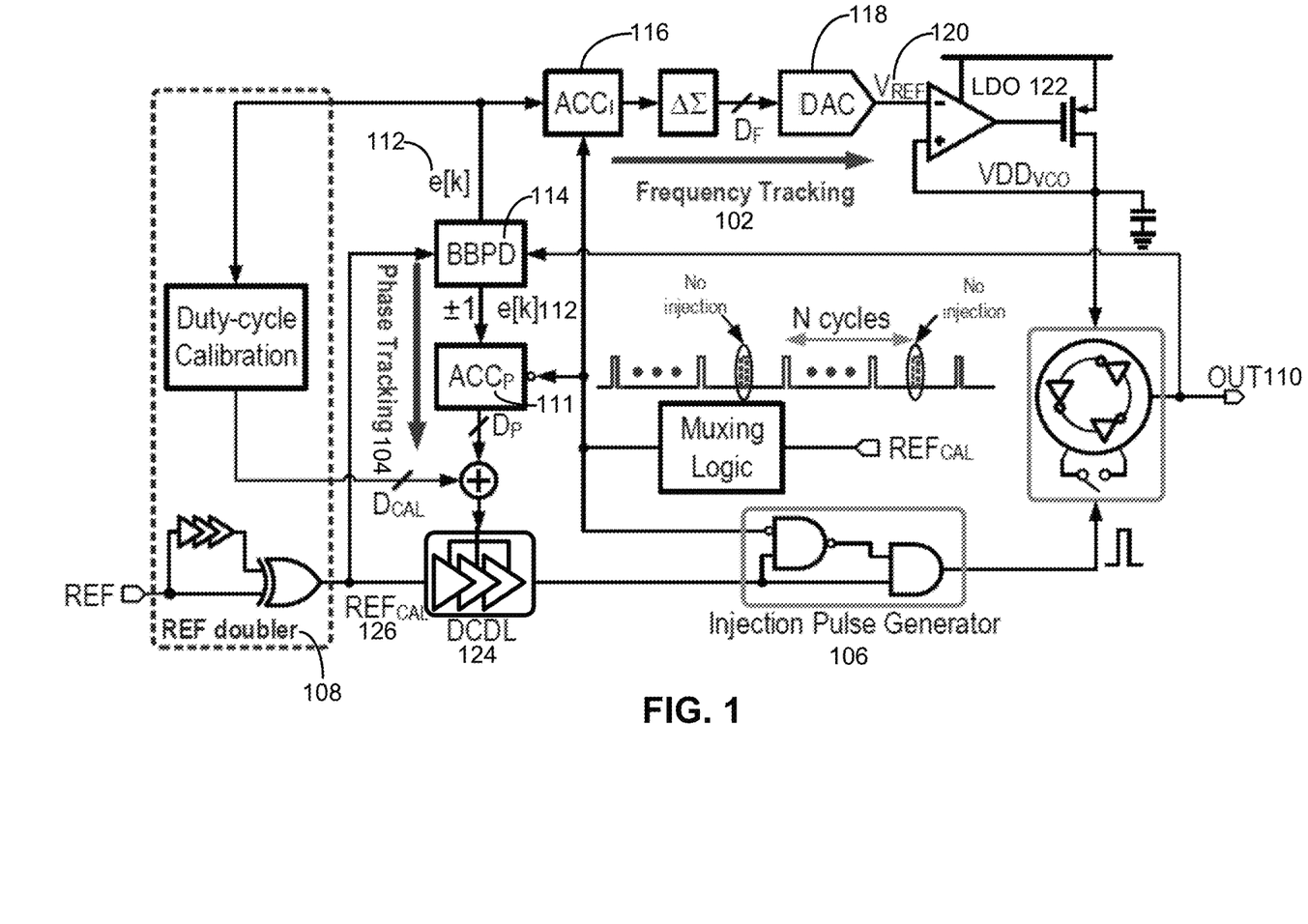
FIG. 1 illustrates an injection-locked PLL in accordance with the disclosed embodiments.

As illustrated in FIG. 1, the proposed injection-locked PLL comprises: a frequency-tracking path 102, a phase-tracking path 104 and an injection pulse generator 106. A reference (REF) doubler 108 increases the injection frequency to achieve high PLL bandwidth for better phase noise suppression of the ring oscillator. The associated reference frequency is at 500 MHz with design targets to achieve higher than 100 MHz of bandwidth.

Because the injection aligns the output (OUT) 110 to the injection pulse, the accumulated phase error during N reference cycles is eliminated during injection. As a consequence, frequency error information is also destroyed. To retain this frequency information, the injection is time-gated, so that the frequency offset information can be tracked. The frequency tracking path 102 accumulates error information (e[k]) 112 from the bang-bang phase detector (BBPD) 114 with a digital accumulator ($ACC_f$) 116. A high-resolution $\Delta\Sigma$ digital-to-analog converter (DAC) 118 converts the accumulated output into analog voltage $V_{REF}$ 120, which controls the frequency of the oscillator through LDO 122. Note that because frequency-tracking path 102 has the lowest bandwidth, the input bandwidth requirement for LDO 122 is greatly relaxed. To effectively suppress the oscillator's flicker noise, a local digital delay-locked loop is used to align the phase-tracking path 104 to the injection pulse position using a digitally controlled delay line (DCDL) 124. In one embodiment, DCDL 124 has a 10-bit range and a nominal resolution of 100 fs, which is chosen to be much lower than the PLL output jitter of about 300 $fs_{rms}$ to ensure a negligible penalty of digital implementation.

Figure 2:
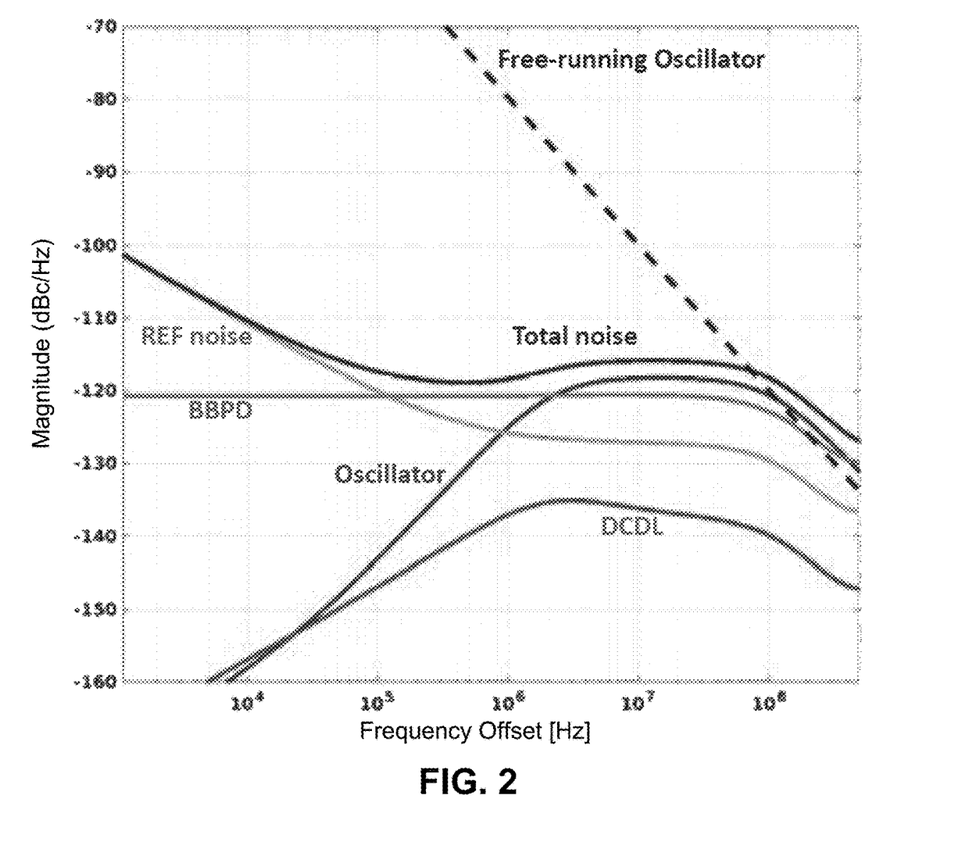
FIG. 2 presents a graph illustrating noise contributions from the main noise sources in a PLL in accordance with the disclosed embodiments.

The main phase noise contributions across frequency offsets are shown in FIG. 2. Note that because there is no suppression of the reference noise, it dominates total noise at low frequencies. In contrast, at very high frequencies (above 100 MHz), the overall noise is dominated by oscillator noise. In the mid-frequency range, the oscillator noise contribution plateaus at around 100 MHz, and more suppression is introduced by a local delay-locked loop with a pole frequency at around 20 MHz. Note that the circuit implementations are digital-intensive and most of the blocks can be synthesized using a standard digital flow.

We next describe important components of the design, including: the supply-regulated ring oscillator and the duty-cycle calibration technique.

Supply-Regulated Ring Oscillator

Figure 3A:
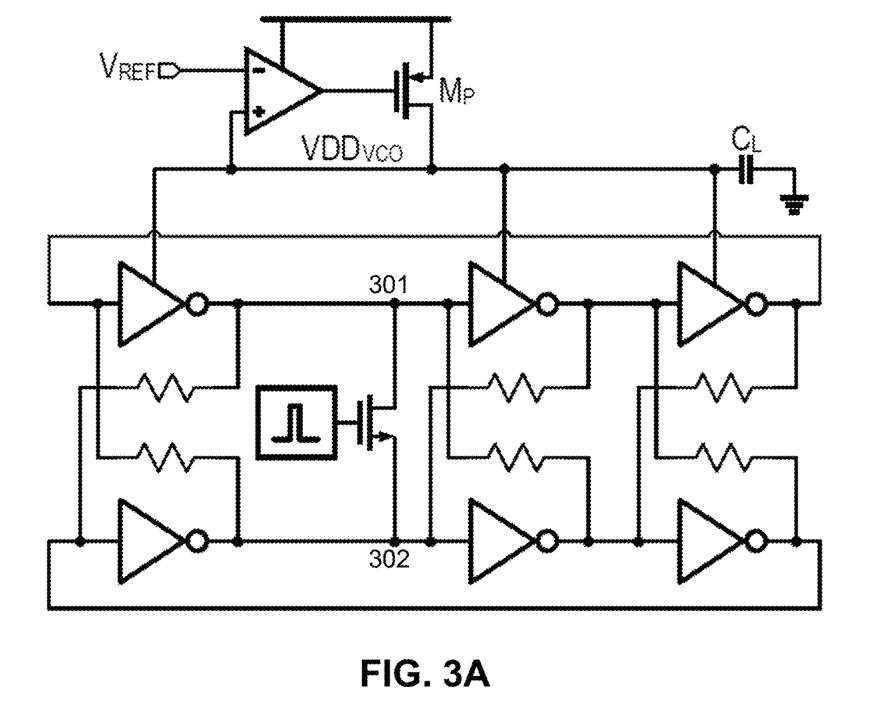
FIG. 3A illustrates a supply-regulated ring oscillator in accordance with the disclosed embodiments.
Figure 3B:
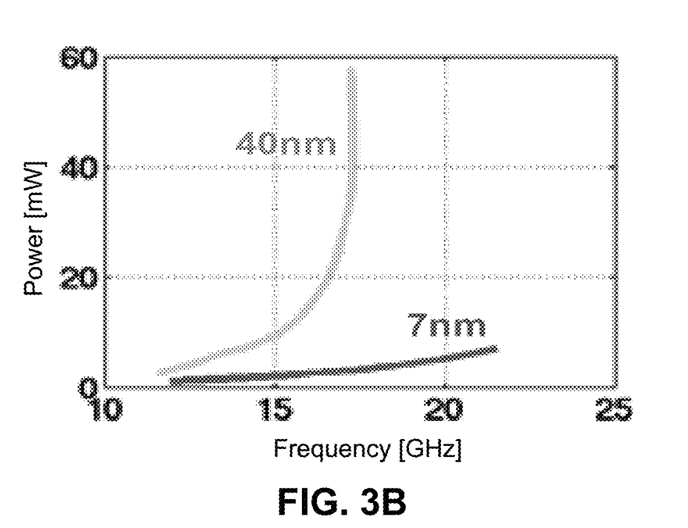
FIG. 3B presents a graph comparing the ring oscillator's power from 10 GHz to 22 GHz at 40 nm and 7 nm technology nodes in accordance with the disclosed embodiments.

Along with the benefit of a wide frequency tuning range, the power consumption of ring oscillators increases excessively when the frequency is pushed to the limit of a technology node. Results of a comparative study on power and frequency trade-offs in 40 nm and 7 nm technology nodes are summarized in FIG. 3B, and a corresponding ring oscillator core is shown in FIG. 3A. Note that a superlinear power increase occurs below 15 GHz in 40 nm, which is much lower than above 22 GHz in 7 nm. This partially explains the reason there are not many existing ring-based oscillators above 10 GHz. In the disclosed embodiments, a nominal operating frequency of 16 GHz is chosen to balance the trade-off between power and frequency and the frequency range is from 12 GHz to 22 GHz.

Figure 3C:
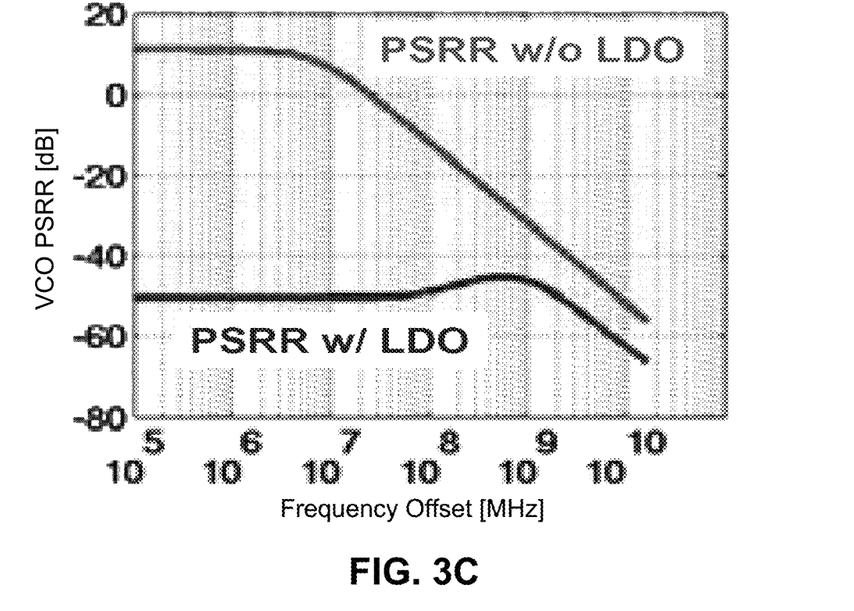
FIG. 3C presents a graph illustrating oscillator power supply rejection ration (PSRR) with and without a low-dropout regulator (LDO) in accordance with the disclosed embodiments.

As illustrated in FIG. 3A, a pseudo-differential ring oscillator is used to provide a differential clock signal that is typically required for high speed signaling. Compared to a latch-based architecture, the illustrated ring oscillator adopts a resistive feedforward architecture because it is more power-efficient at higher operating frequencies. Note that the injection behavior is controlled by NMOS switches. During normal operation, the NMOS switches short the two nodes 301 and 302 when both nodes are close to a zero-crossing point. This shorting resets the accumulated phase noise and cleans up the oscillator output. The supply voltage of the oscillator is regulated using an LDO 122 to provide good supply noise suppression at low and medium frequencies. As shown in FIG. 3C, in the frequency locked condition without the LDO, the supply noise is amplified by a common gate amplifier. With the LDO, the feedback loop attenuates the noise by 50 dB at low frequency. Moreover, at high frequencies, the response is dominated by $C_L$.

Figure 3D:
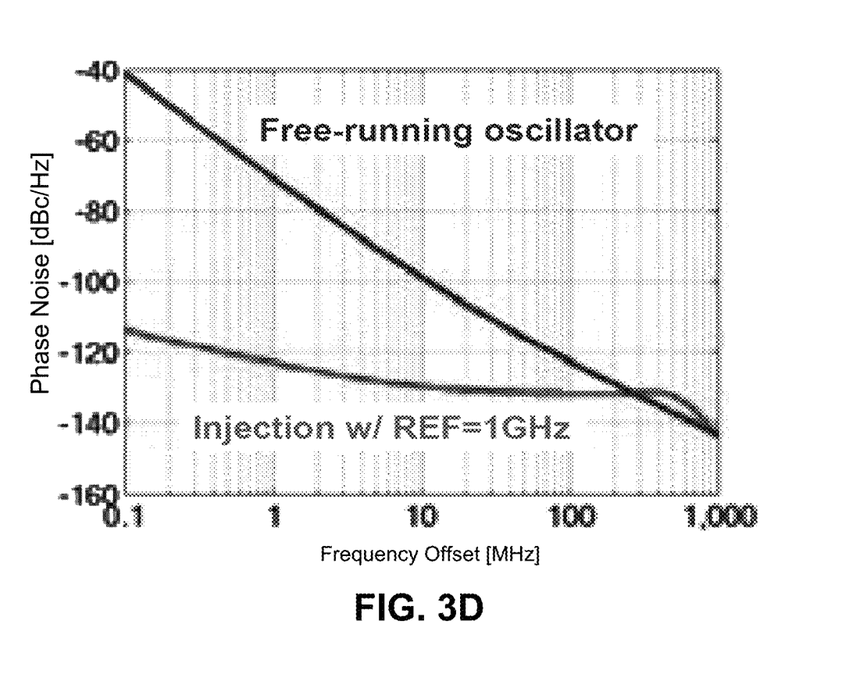
FIG. 3D presents a graph illustrating phase noise performance with and without injection in accordance with the disclosed embodiments.

FIG. 3D summarizes the phase noise performance of the oscillator including the LDO simulated with an extracted post-layout netlist. Note that at 16 GHz, the free-running oscillator achieves −99 dBc/Hz at a 10 MHz frequency offset with a 3 mA current. Also, with a 2× reference frequency at 1 GHz, the injection behavior provides about 100 MHz bandwidth to suppress oscillator noise, as can be estimated from the end of the flat region in the phase noise plots. The flat region indicates that the injection operation provides about 20 dB/decade suppression to the oscillator noise, and the slope changes at low frequencies around the flicker noise corner frequency, which is about 10 MHz for this oscillator.

Digital Duty-Cycle Calibration for the Reference Doubler

The reference doubler 108 illustrated in FIG. 1 was introduced to increase the injection frequency by a factor of two, thereby increasing the effective injection strength, which can lead to an increase in the PLL bandwidth to better suppress oscillator phase noise. However, any duty-cycle distortion (DCD) directly translates to the periodic modulation on the rising edge of the REF$_{CAL}$ signal 126 illustrated in FIG. 1. This duty-cycle distortion leads to non-aligned injection points, which introduce deterministic jitter into the output signal. Fortunately, this periodic modulation behavior is deterministic and can be cancelled through duty-cycle calibration.

Note that the duty-cycle distortion has a very particular signature that we can exploit to facilitate correction of the distortion. Duty-cycle distortion can be thought of as advancing the rising edge by +Δt, and retarding the falling edge by −Δt, for a duty-cycle less than 0.5, and vice-versa for a duty cycle greater than 0.5. Hence, we can divide the time differential evenly between rising and falling edges. When the frequency loop locks to the correct frequency, the oscillator receives a similar number of retarded/advanced edges during injection. On the other hand, if we observe the output of the phase detector during the locked condition, i.e., the frequency has already settled, then we observe a +1, −1, +1, −1, . . . pattern (or its inverse), because the first edge is advanced and the following edge is retarded (and vice-versa for the inverse pattern). If we correlate this pattern with a +1, −1, +1, −1 pattern, then we will receive a +1, +1, +1, +1 signal, where we can think of the correlation as multiplying the phase detector pattern with the fixed pattern. This indicates there is a +1/−1 duty-cycle distortion pattern. Note that if, instead, we get a −1/+1 pattern, the correlation will result in a −1, −1, −1, −1 pattern. Thus, the correlation of the phase-detector pattern allows us to measure the deviations of the duty cycle around the 0.5 point. In particular, for a +1/−1 pattern, which results in a +1 correlation, we can selectively slow down the first edge and speed up the second edge.

Figure 4:
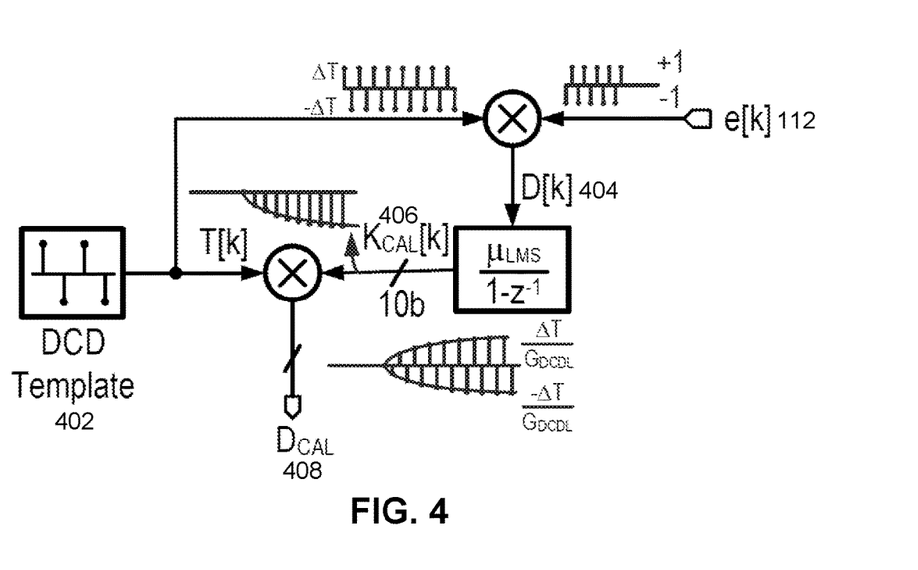
FIG. 4 presents a diagram illustrating the principle behind the duty-cycle calibration technique in accordance with the disclosed embodiments.

More specifically, the duty-cycle calibration technique operates by decomposing a clock signal with DCD into periodically alternating positive and negative error pulses at rising and falling edges. These alternating positive and negative pulses are the sources of DCD and appear in e[k] signal 112, which is produced by BBPD 114. To mitigate the influence of the DCD, the technique uses a DCD template 402 as is illustrated in FIG. 44, which has the same pattern as the DCD. Note that DCD template 402 is correlated with e[k] signal 112 to facilitate extracting the DCD information into D[k] signal 404. Next, a least-mean square (LMS) adaptation loop accumulates D[k] signal 404 to generate a gain K$_{CAL}$ 406 to control the right amount of calibration for D$_{CAL}$ 408, which is applied to DCDL 124 illustrated in FIG. 1.

Figure 5:
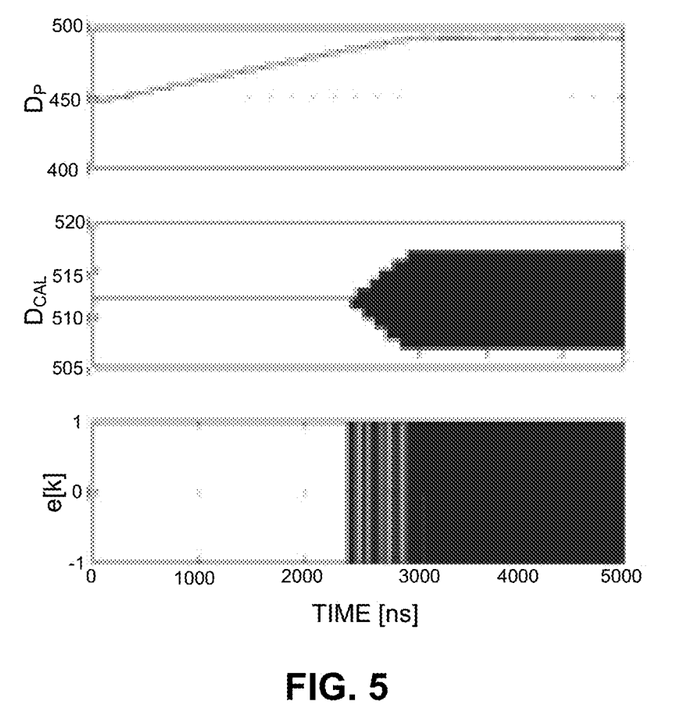
FIG. 5 presents a graph illustrating simulated transient behavior of the duty-cycle calibration technique in accordance with the disclosed embodiments.

Results of a transient simulation demonstrating the behavior of the calibration are illustrated in FIG. 5. Note that after release of the reset signal, the error signal e[k] 112 is always positive (+1) due to the phase mismatch at the input of BBPD 114. Note that the phase-tracking path 104 eliminates this phase mismatch by increasing ACC$_P$ 111. The calibration loop operates in the background. However, no change on D$_{CAL}$ signal 408 is generated because the e[k] signal 112 is stuck at one direction and D[k] 404 is zero on average. After ACC$_P$ 111 settles (and the phase mismatch is cancelled), the error signal starts to show DCD information, and the least mean square (LMS) computation converges to the proper D$_{CAL}$ signal 408 to cancel the DCD.

Implementation Results

Figure 6A:
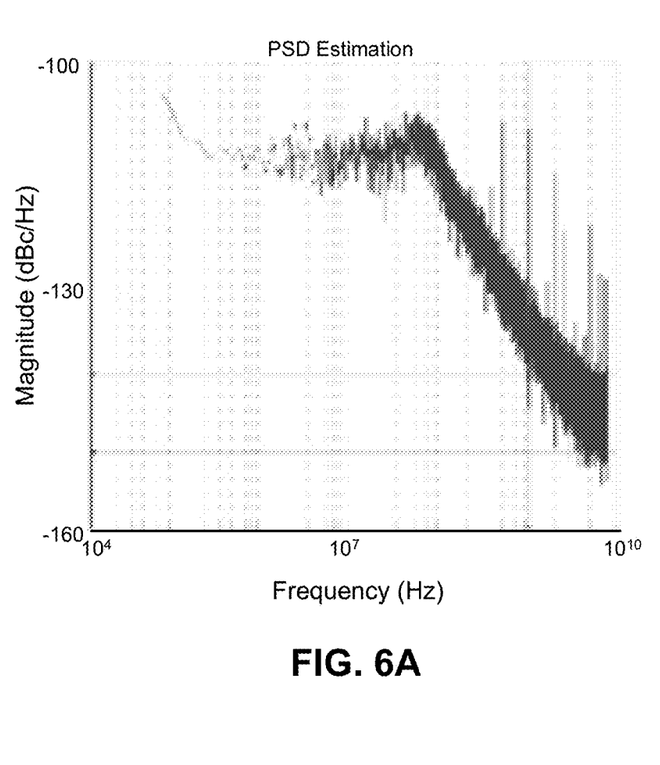
FIG. 6A presents a graph illustrating simulation results of the estimated power spectrum for the injection-locked PLL in accordance with the disclosed embodiments.
Figure 6B:
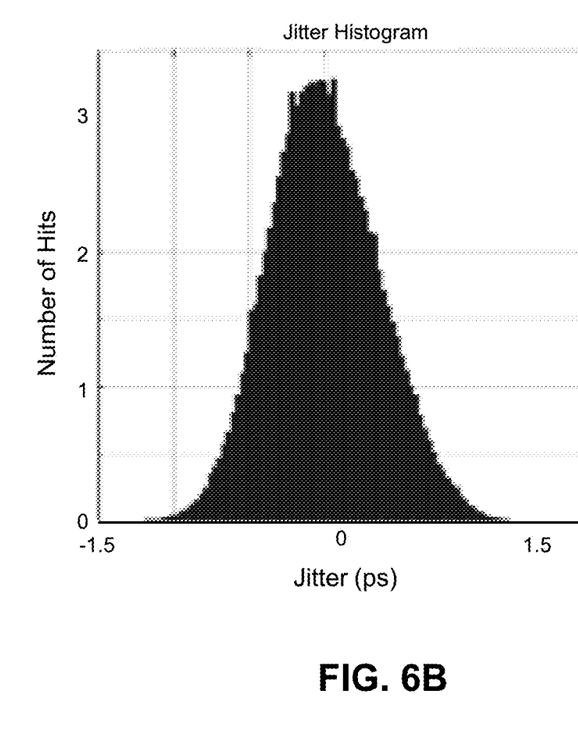
FIG. 6B presents a simulated histogram for zero-crossing locations for the injection-locked PLL in accordance with the disclosed embodiments.

The jitter performance of the PLL was estimated based on about 1,000,000 zero-crossing locations of output clock signal. FIG. 6A presents the resulting estimated power spectrum, and FIG. 6B plots the associated histogram of the zero crossings. Note that the output clock signal has a 275 fs RMS jitter and a 2.69 ps peak-to-peak jitter.

Process of Operation for a Clock Generator

Figure 7:
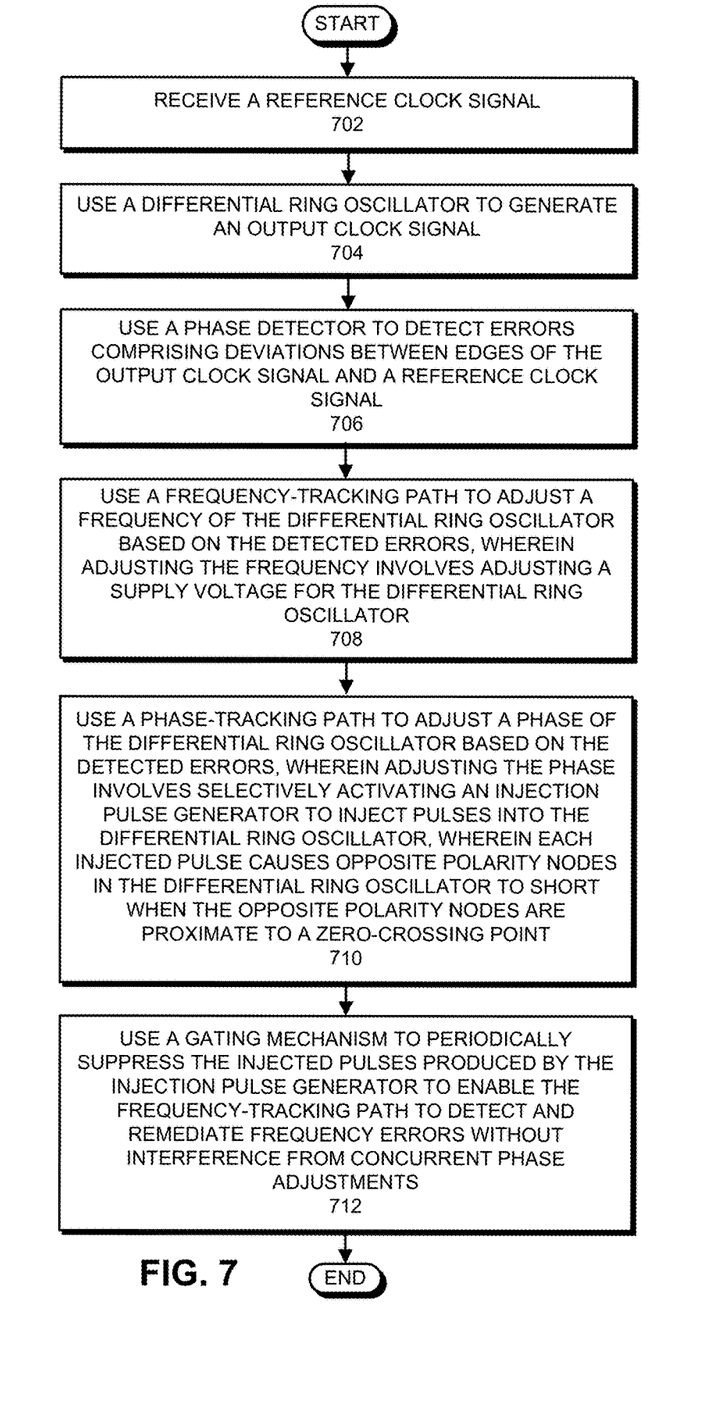
FIG. 7 presents a flow chart illustrating the process of operating a clock generator in accordance with the disclosed embodiments.

FIG. 7 presents a flow chart illustrating the process of operating a clock generator in accordance with the disclosed embodiments. During operation, the system receives a reference clock signal (step 702). The system also uses a differential ring oscillator to generate an output clock signal (step 704). Next, the system uses a phase detector to detect errors comprising deviations between edges of the output clock signal and a reference clock signal (step 706). The system then uses a frequency-tracking path to adjust a frequency of the differential ring oscillator based on the detected errors, wherein adjusting the frequency involves adjusting a supply voltage for the differential ring oscillator (step 708). The system concurrently uses a phase-tracking path to adjust a phase of the differential ring oscillator based on the detected errors, wherein adjusting the phase involves selectively activating an injection pulse generator to inject pulses into the differential ring oscillator, and wherein each injected pulse causes opposite polarity nodes in the differential ring oscillator to short when the opposite polarity nodes are proximate to a zero-crossing point (step 710). Finally, the system uses a gating mechanism to periodically suppress the injected pulses produced by the injection pulse generator to enable the frequency-tracking path to detect and remediate frequency errors without interference from concurrent phase adjustments (step 712).

Duty-Cycle Correction Process

Figure 8:
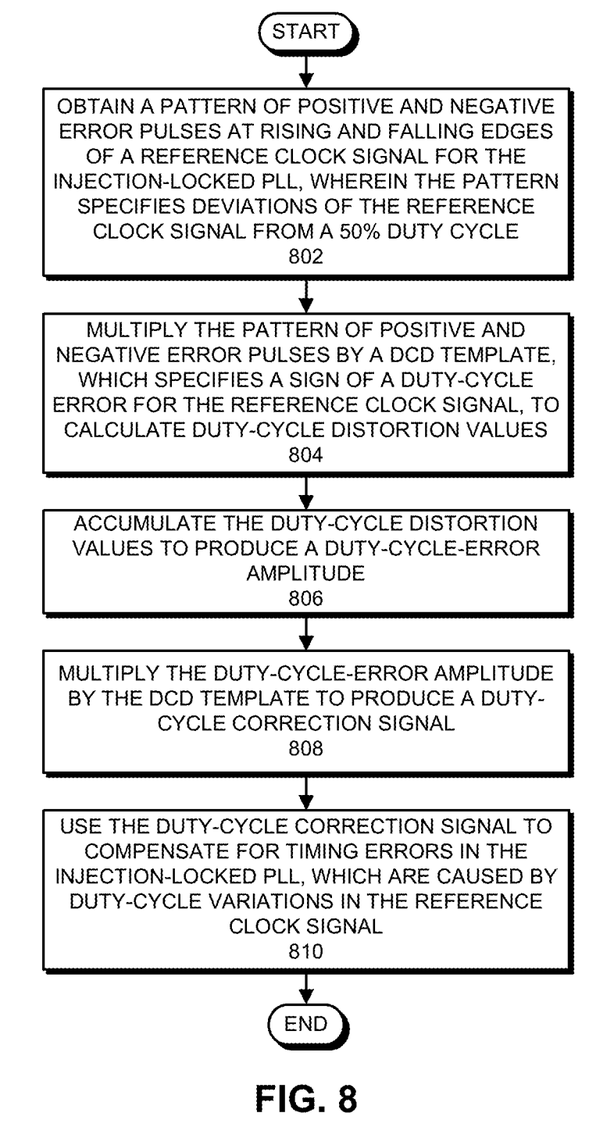
FIG. 8 presents a flow chart illustrating the duty-cycle correction process in accordance with the disclosed embodiments.

FIG. 8 presents a flow chart illustrating the duty-cycle correction process in accordance with the disclosed embodiments. During operation, the system first obtains a pattern of positive and negative error pulses at rising and falling edges of a reference clock signal for the injection-locked PLL, wherein the pattern specifies deviations of the reference clock signal from a 50% duty cycle (step 802). Next, the system multiplies the pattern of positive and negative error pulses by a DCD template, which specifies a sign of a duty-cycle error for the reference clock signal, to calculate duty-cycle distortion values (step 804). The system then accumulates the duty-cycle distortion values to produce a duty-cycle-error amplitude (step 806). Next, the system multiplies the duty-cycle-error amplitude by the DCD template to produce a duty-cycle correction signal (step 808). Finally, the system uses the duty-cycle correction signal to compensate for timing errors in the injection-locked PLL, which are caused by duty-cycle variations in the reference clock signal (step 810).

System

Figure 9:
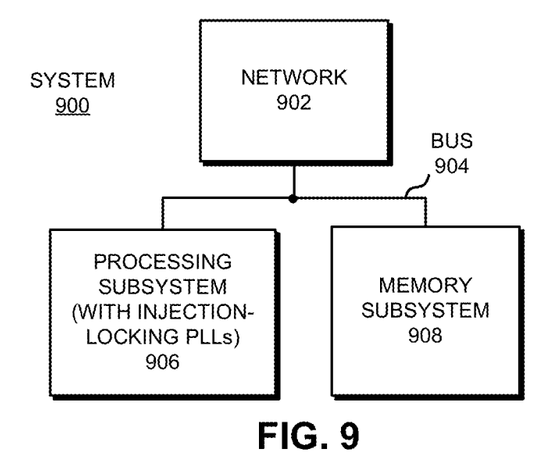
FIG. 9 illustrates a computer system that includes one or more injection-locked PLLs in accordance with the disclosed embodiments.

One or more of the preceding embodiments of the injection-locked PLL may be included in a system or device. More specifically, FIG. 9 illustrates a system 900 that includes a network 902 and a processing subsystem 906 comprising one or more processors (which include one or more injection-locked PLLs) and a memory subsystem 908 comprising a random-access memory.

In general, components within system 900 may be implemented using a combination of hardware and/or software. Thus, system 900 may include one or more program modules or sets of instructions stored in a memory subsystem 908 (such as DRAM or another type of volatile or non-volatile computer-readable memory), which, during operation, may be executed by processing subsystem 906. Furthermore, instructions in the various modules in memory subsystem 908 may be implemented in: a high-level procedural language, an object-oriented programming language, and/or in an assembly or machine language. Note that the programming language may be compiled or interpreted, e.g., configurable or configured, to be executed by the processing subsystem.

Components in system 900 may be coupled by signal lines, links or buses, such as bus 904. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 900 may be at one location or may be distributed over multiple, geographically dispersed locations.

System 900 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, network 902 can be used in a wide variety of applications, such as: communications (for example, in a transceiver, an optical interconnect or an optical link, such as for intra-chip or inter-chip communication), a radio-frequency filter, a biosensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A duty-cycle correction circuit for an injection-locked phase-locked loop (PLL), comprising a digital calibration circuit, which performs a duty-cycle correction operation by:

obtaining a pattern of positive and negative error pulses at rising and falling edges of a reference clock signal for the injection-locked PLL, wherein the pattern specifies deviations of the reference clock signal from a 50% duty cycle;

multiplying the pattern of positive and negative error pulses by a duty-cycle distortion (DCD) template, which specifies a sign of a duty-cycle error for the reference clock signal, to calculate duty-cycle distortion values;

accumulating the duty-cycle distortion values to produce a duty-cycle-error amplitude;

multiplying the duty-cycle-error amplitude by the DCD template to produce a duty-cycle correction signal; and using the duty-cycle correction signal to compensate for timing errors in the injection-locked PLL, which are caused by duty-cycle variations in the reference clock signal.

2. The duty-cycle correction circuit of claim 1, wherein the duty-cycle correction circuit obtains the pattern of positive and negative error pulses from a phase detector in the injection-locked PLL.

3. The duty-cycle correction circuit of claim 1, wherein the DCD template specifies alternating positive and negative signs associated with a duty-cycle error of the reference clock signal.

4. The duty-cycle correction circuit of claim 1, further comprising the injection-locked PLL, wherein the injection-locked PLL comprises:
a reference input, which receives the reference clock signal;
a frequency doubler, which doubles the frequency of the reference clock signal to produce a doubled reference clock signal;
a ring oscillator, which generates an output clock signal;
a phase detector, which detects errors comprising deviations between edges of the output clock signal and the doubled reference clock signal;
a frequency-tracking path, which adjusts a frequency of the ring oscillator based on the detected errors;
a phase-tracking path, which adjusts a phase of the ring oscillator based on the detected errors by injecting pulses into the ring oscillator;
a gating mechanism, which periodically suppresses the injected pulses to allow the frequency-tracking path to detect and remediate frequency errors without interference from concurrent phase adjustments; and
the duty-cycle correction circuit, which corrects errors in the doubled reference clock signal caused by duty-cycle errors in the reference clock signal.

5. The duty-cycle correction circuit of claim 4, wherein while correcting the errors in the doubled reference clock signal, the duty-cycle correction circuit uses the duty-cycle correction signal to control a digitally controlled delay line (DCDL), which introduces corrective delays into the doubled reference clock signal.

6. The clock generator of claim 5, wherein the duty-cycle correction signal is applied to the DCDL during a falling edge of the doubled reference clock signal to correct a timing of a subsequent rising edge of the doubled reference clock signal.

7. The duty-cycle correction circuit of claim 6, wherein the phase-tracking path of the injection-locked PLL comprises:
a digital phase accumulator, which accumulates detected errors from the phase detector to produce a phase-accumulator output;
an adder, which adds the phase-accumulator output to the duty-cycle correction signal to produce a composite correction signal for overall phase adjustment; and
the DCDL that inserts a variable delay, which is determined based on the composite correction signal, into the doubled reference clock signal to produce a corrected doubled reference clock signal.

8. The duty-cycle correction circuit of claim 4, wherein the frequency-tracking path of the injection-locked PLL comprises:
a digital accumulator, which accumulates detected errors from the phase detector;
a digital-to-analog converter, which converts an output of the digital accumulator into an analog reference voltage $V_{REF}$; and
a low-dropout voltage regulator, which generates the supply voltage for the ring oscillator based on $V_{REF}$, wherein the supply voltage of the ring oscillator affects a frequency of the ring oscillator.

9. The duty-cycle correction circuit of claim 4, wherein the phase detector of the injection-locked PLL comprises a bang-bang phase detector.

10. A method of performing a duty-cycle correction operation for an injection-locked phase-locked loop (PLL), comprising:
obtaining a pattern of positive and negative error pulses at rising and falling edges of a reference clock signal for the injection-locked PLL, wherein the pattern specifies deviations of the reference clock signal from a 50% duty cycle;
multiplying the pattern of positive and negative error pulses by a duty-cycle distortion (DCD) template, which specifies a sign of a duty-cycle error for the reference clock signal, to calculate duty-cycle distortion values;
accumulating the duty-cycle distortion values to produce a duty-cycle-error amplitude;
multiplying the duty-cycle-error amplitude by the DCD template to produce a duty-cycle correction signal; and
using the duty-cycle correction signal to compensate for timing errors in the injection-locked PLL, which are caused by duty-cycle variations in the reference clock signal.

11. The method of claim 10, wherein the pattern of positive and negative error pulses is obtained from a phase detector in the injection-locked PLL.

12. The method of claim 10, wherein the DCD template specifies alternating positive and negative signs associated with a duty-cycle error of the reference clock signal.

13. The method of claim 10, wherein the injection-locked PLL comprises:
a reference input, which receives the reference clock signal;
a frequency doubler, which doubles a frequency of the reference clock signal to produce a doubled reference clock signal;
a ring oscillator, which generates an output clock signal;
a phase detector, which detects errors comprising deviations between edges of the output clock signal and the doubled reference clock signal;
a frequency-tracking path, which adjusts a frequency of the ring oscillator based on the detected errors;
a phase-tracking path, which adjusts a phase of the ring oscillator based on the detected errors by injecting pulses into the ring oscillator;
a gating mechanism, which periodically suppresses the injected pulses to allow the frequency-tracking path to detect and remediate frequency errors without interference from concurrent phase adjustments; and
a duty-cycle correction circuit, which corrects errors in the doubled reference clock signal caused by duty-cycle errors in the reference clock signal.

14. The method of claim 13, wherein while correcting the errors in the doubled reference clock signal, the duty-cycle correction circuit uses the duty-cycle correction signal to control a digitally controlled delay line (DCDL), which introduces corrective delays into the doubled reference clock signal.

15. The method of claim 14, wherein the duty-cycle correction signal is applied to the DCDL during a falling edge of the doubled reference clock signal to correct a timing of a subsequent rising edge of the doubled reference clock signal.

16. The method of claim 15, wherein the phase-tracking path of the injection-locked PLL comprises:
a digital phase accumulator, which accumulates detected errors from the phase detector to produce a phase-accumulator output;
an adder, which adds the phase-accumulator output to the duty-cycle correction signal to produce a composite correction signal; and
the DCDL that inserts a variable delay, which is determined based on the composite correction signal, into the doubled reference clock signal to produce a corrected doubled reference clock signal.

17. The method of claim 13, wherein the frequency-tracking path of the injection-locked PLL comprises:
a digital accumulator, which accumulates detected errors from the phase detector;
a digital-to-analog converter, which converts an output of the digital accumulator into an analog reference voltage $V_{REF}$; and
a low-dropout voltage regulator, which generates the supply voltage for the ring oscillator based on $V_{REF}$, wherein the supply voltage of the ring oscillator affects a frequency of the ring oscillator.

18. The method of claim 13, wherein the phase detector of the injection-locked PLL comprises a bang-bang phase detector.

19. A computer system, comprising:
at least one processor and at least one associated memory; and
a clock generator that provides a clock signal for the at least one processor, wherein the clock generator is implemented using an injection-locked phase-locked loop (PLL), and includes a duty-cycle correction;
wherein the duty-cycle correction comprises a digital circuit, which performs a duty-cycle correction operation by:
obtaining a pattern of positive and negative error pulses at rising and falling edges of a reference clock signal for the injection-locked PLL,
wherein the pattern specifies deviations of the reference clock signal from a 50% duty cycle,
multiplying the pattern of positive and negative error pulses by a duty-cycle distortion (DCD) template, which specifies a sign of a duty-cycle error for the reference clock signal, to calculate duty-cycle distortion values;
accumulating the duty-cycle distortion values to produce a duty-cycle-error amplitude,
multiplying the duty-cycle-error amplitude by the DCD template to produce a duty-cycle correction signal, and
using the duty-cycle correction signal to compensate for timing errors in the injection-locked PLL, which are caused by duty-cycle variations in the reference clock signal.

20. The computer system of claim 19, wherein while compensating for timing errors in the injection-locked PLL, the duty-cycle correction circuit uses the duty-cycle correction signal to control a digitally controlled delay line (DCDL), which introduces corrective delays into a reference clock signal for the injection-locked PLL.

\* \* \* \* \*

UNITED STATES PATENT AND TRADEMARK OFFICE
CERTIFICATE OF CORRECTION

PATENT NO. : 10,461,755 B2  
APPLICATION NO. : 15/980467  
DATED : October 29, 2019  
INVENTOR(S) : Shu et al.

Page 1 of 1

It is certified that error appears in the above-identified patent and that said Letters Patent is hereby corrected as shown below:

In Column 6, Line 24, delete "FIG. 44," and insert -- FIG. 4, -- therefor.

Signed and Sealed this  
Twenty-seventh Day of April, 2021

Drew Hirshfeld  
*Performing the Functions and Duties of the*  
*Under Secretary of Commerce for Intellectual Property and*  
*Director of the United States Patent and Trademark Office*